United States Patent
Suh

(10) Patent No.: US 7,518,198 B2
(45) Date of Patent: Apr. 14, 2009

(54) TRANSISTOR AND METHOD FOR MANUFACTURING THE SAME

(75) Inventor: Moon Sik Suh, Yongin-si (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 11/759,530

(22) Filed: Jun. 7, 2007

(65) Prior Publication Data

US 2007/0284639 A1 Dec. 13, 2007

Related U.S. Application Data

(62) Division of application No. 11/039,746, filed on Jan. 18, 2005, now Pat. No. 7,244,650.

(30) Foreign Application Priority Data

May 25, 2004 (KR) ................. 2004-37552

(51) Int. Cl.
*H01L 27/108* (2006.01)
*H01L 29/76* (2006.01)
*H01L 29/94* (2006.01)
*H01L 31/119* (2006.01)
*H01L 31/062* (2006.01)
*H01L 31/113* (2006.01)

(52) U.S. Cl. ........................ 257/408; 257/306
(58) Field of Classification Search ......... 257/295–310, 257/314–316, 368–412
See application file for complete search history.

(56) References Cited

U.S. PATENT DOCUMENTS

| 5,955,760 | A | 9/1999 | Kao et al. |
| 6,172,394 | B1* | 1/2001 | Nakagawa ................. 257/315 |
| 6,262,447 | B1 | 7/2001 | Chi |
| 6,274,441 | B1 | 8/2001 | Mandelman et al. |
| 6,380,585 | B1* | 4/2002 | Odanaka et al. ............. 257/316 |
| 6,387,720 | B1 | 5/2002 | Misheloff et al. |
| 6,399,978 | B2* | 6/2002 | Gruening et al. ............ 257/301 |
| 6,790,724 | B1 | 9/2004 | Chin et al. |
| 7,045,846 | B2 | 5/2006 | Jang et al. |
| 7,102,187 | B2 | 9/2006 | Yoo |

* cited by examiner

*Primary Examiner*—Cuong Q Nguyen
(74) *Attorney, Agent, or Firm*—Marshall, Gerstein & Borun LLP

(57) ABSTRACT

A transistor including a semiconductor substrate defined with an active region and a device isolation region, a gate formed on the semiconductor substrate, an insulating spacers formed on respective side walls of the gate, and source/drain junctions formed in the semiconductor substrate at opposite sides of the gate, the source/drain junctions having asymmetrical junction structures, respectively, wherein the gate has a lower portion arranged on the active region of the substrate, the lower gate portion having a stepped profile having a lower surface, an upper surface and a vertically-extending side surface. The invention also provides a method for manufacturing this transistor. In accordance with this transistor structure, an increase in the dopant concentration of a storage node is prevented. Accordingly, a reduction in the amount of leakage current is achieved, so that an improvement in the refresh characteristics of the transistor is achieved.

6 Claims, 8 Drawing Sheets

TRANSISTOR AND METHOD FOR MANUFACTURING THE SAME

CROSS-REFERENCE TO RELATED APPLICATIONS

This patent is a divisional of U.S. patent application Ser. No. 11/039,746 filed Jan. 18, 2005, the disclosure of which is hereby expressly incorporated for all purposes.

FIELD OF THE INVENTION

The present invention relates to a semiconductor device and a method for manufacturing the semiconductor device, and, more particularly, to a transistor capable of improving the refresh characteristics of an associated cell in a dynamic random access memory (DRAM), which has a highly integrated structure including a group of cells, and a method for manufacturing the transistor.

DESCRIPTION OF THE RELATED ART

A DRAM device is well known as a memory device to store data and to allow the stored date to be subsequently read out when the reading of the data is required. This DRAM device is composed of a group of cells each consisting of a capacitor to store data, that is, charge, and a transistor to perform a switching operation to discharge the charge stored in the capacitor.

The data storage of the DRAM device means that charge is accumulated in the capacitors of the DRAM device. Ideally, the charge stored in the capacitors does not disappear. However, recently-developed memory devices have a tendency to have a reduced design rule, so that they have a reduced channel length between a source and a drain in each transistor. As a result, an increase in threshold voltage or an increase in the amount of leakage current at junction regions may occur. For this reason, the data stored in the capacitors may be lost. Also, the refresh characteristics to re-charge the lost charge may be degraded.

In order to prevent such a degradation in refresh characteristics, ion implantation for control of channel threshold voltage may be additionally performed under the condition in which the junction region where each capacitor is joined with a contact, that is, a storage node, is partially shielded during the channel ion implantation process. In this case, however, an abrupt increase in the ion concentration of channel regions occurs, thereby causing a degradation in refresh characteristics.

Hereinafter, the problems incurred in conventional methods of manufacturing the transistors of a semiconductor device will be described with reference to the annexed drawings.

FIGS. 1A and 1B are schematic sectional views respectively illustrating sequential processing steps of a conventional method for manufacturing transistors.

Although not shown, various required ion implantation processes, that is, ion implantation processes for formation of wells, field stop, punch stop and control of channel threshold voltage, are first performed for a silicon substrate 10.

Thereafter, as shown in FIG. 1A, a gate oxide film 20 and a gate polysilicon layer (not shown) are deposited over the silicon substrate 10, and are then subjected to a selective photolithography process to form gate electrodes 30. Subsequently, an insulating material is deposited over the entire upper surface of the substrate 10 formed with the gate electrodes 30, and is then selectively etched to form gate spacers 40 made of the insulating material at respective side walls of the gate electrodes.

Using the gate spacers 40 as an ion implantation mask, an impurity ion implantation process is then carried out for the silicon substrate 10 to form junction regions 50 for formation of cell junction regions.

Thereafter, as shown in FIG. 1B, a photoresist film pattern 60 is formed on the upper surface of the silicon substrate 10 to expose only portions of the upper surface of the silicon substrate 10 respectively corresponding to regions where junctions to contact bit lines, to be subsequently formed, are to be formed as bit line nodes, respectively. Channel threshold ion implantation is then performed. Thus, an asymmetrical junction structure is formed.

FIG. 2 is a schematic view illustrating a simulated electric field distribution of transistors manufactured in accordance with the above-mentioned conventional method. Referring to FIG. 2, it can be seen that the transistors exhibit a threshold voltage Vt of about 1.7E13V and a maximum electric field intensity of about 0.58MV/cm. That is, it can be seen that a high electric field intensity is exhibited at junction regions.

Thus, when an additional ion implantation process is performed only for the junctions to contact the bit lines, that is, the bit line nodes, in accordance with the conventional method, the impurity concentration of the channel regions is abnormally increased due to the reduced design rule of the DRAM device to be manufactured through the conventional method. As a result, the doping profile established between the channel and the junction is rendered to be sharp, so that an increase in electric field intensity occurs, thereby causing a degradation in refresh characteristics.

SUMMARY OF THE INVENTION

The present invention has been made in view of the above-mentioned problems, and it is an object of the invention to provide a transistor of a DRAM cell having asymmetrical ion concentration profiles of bit line and storage nodes while preventing an ion diffusion between the bit line and storage nodes to prevent an increase in the ion concentration of the storage node, thereby being capable of securing desired refresh characteristics of the DRAM cell.

In accordance with one aspect, the present invention provides a transistor comprising: a semiconductor substrate defined with an active region and a device isolation region; a gate formed on the semiconductor substrate; insulating spacers formed on respective side walls of the gate; and source/drain junctions formed in the semiconductor substrate at opposite sides of the gate, the source/drain junctions having asymmetrical junction structures, respectively, wherein the gate has a lower portion arranged on the active region of the substrate, the lower gate portion having a stepped profile having a lower surface, an upper surface and a vertically-extending side surface.

The side surface of the stepped profile may have a height of 50 to 2,500 Å. The side surface may also have an inclination of 10 to 90°.

The lower and upper surfaces of the stepped profile may have the same area.

The lower surface of the stepped profile may be arranged adjacent to a bit line node. Alternatively, the lower surface of the stepped profile may extend over a storage node and a predetermined portion of the device isolation region arranged adjacent to the storage node.

In accordance with another aspect, the present invention provides a method for manufacturing a transistor, comprising the steps of: forming a device isolation film on a semiconductor substrate to define an active region and a device isolation region in the semiconductor substrate; forming a step gate mask on the active region of the semiconductor substrate; etching the semiconductor substrate to a predetermined depth, using the step gate mask as an etch mask, thereby forming a stepped profile; implanting first threshold voltage control ions into the semiconductor substrate formed with the stepped profile; forming a gate on the semiconductor substrate implanted with the first threshold voltage control ions; forming a mask on the semiconductor substrate formed with the gate to shield a storage node region and to expose a bit line node region; implanting second threshold voltage control ions into the exposed bit line node region, using the mask as an ion implantation mask; and removing the mask, and then implanting source/drain formation ions into the semiconductor substrate, thereby forming source/drain junctions.

The predetermined depth in the step of etching the semiconductor substrate using the step gate mask as the etch mask may be 50 to 2,500 Å. The semiconductor substrate in the step of etching the semiconductor substrate using the step gate mask as the etch mask may be etched to have an inclination of 10 to 90°.

The step gate mask may have a width corresponding to 1 to 3.5 times the width of the gate.

The second threshold voltage control ions may have a concentration higher than the concentration of the first threshold voltage control ions by 1E17/cm3 or above.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Hereinafter, the present invention will be described in detail in conjunction with exemplary embodiments, with reference to the annexed drawings, so as to enable skilled persons in the art to readily implement the present invention. However, the present invention is not limited to the illustrated embodiments, and other embodiments may be implemented.

In order to clearly define layers and regions to be described in the following description, those layers and regions are shown in an exaggerated state, in particular, in term of thickness, in the annexed drawings.

Transistors and manufacturing methods thereof according to exemplary embodiments of the present invention will now be described in conjunction with the annexed drawings.

First, a transistor according to a first embodiment of the present invention will be described.

Figure 1A:
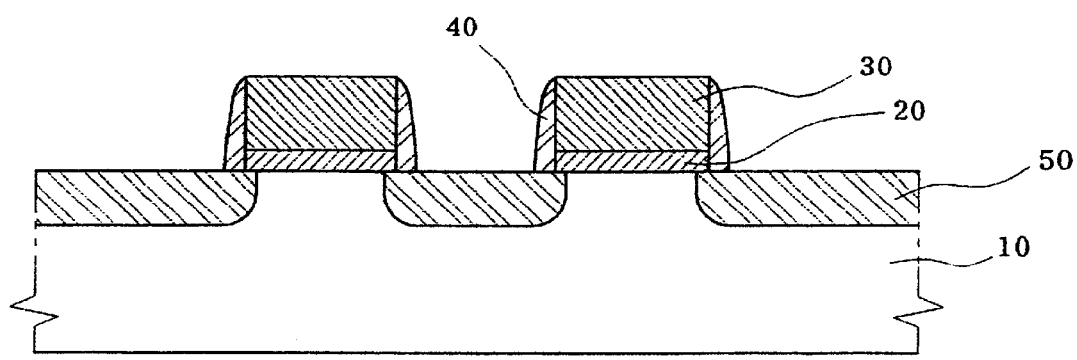
FIGS. 1A and 1B are schematic sectional views respectively illustrating sequential processing steps of a conventional method for manufacturing transistors.
Figure 1B:
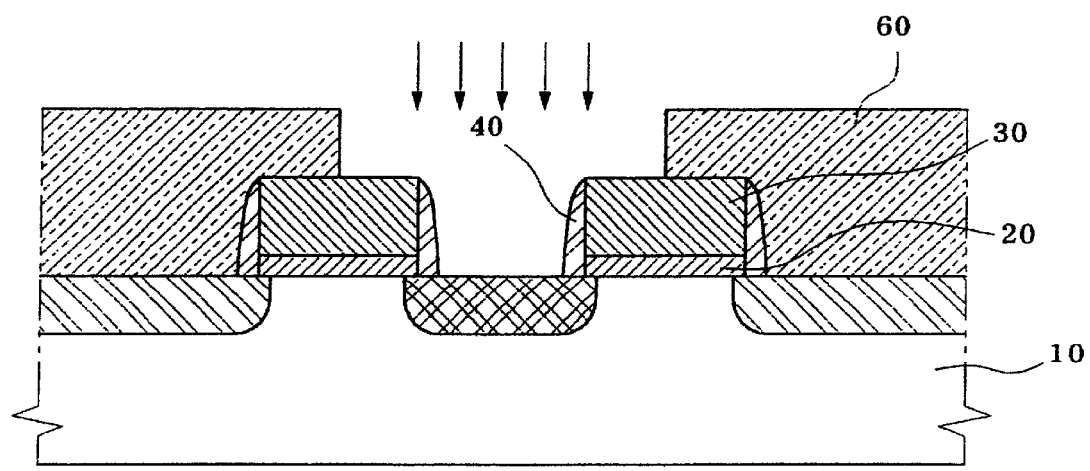
Figure 2:
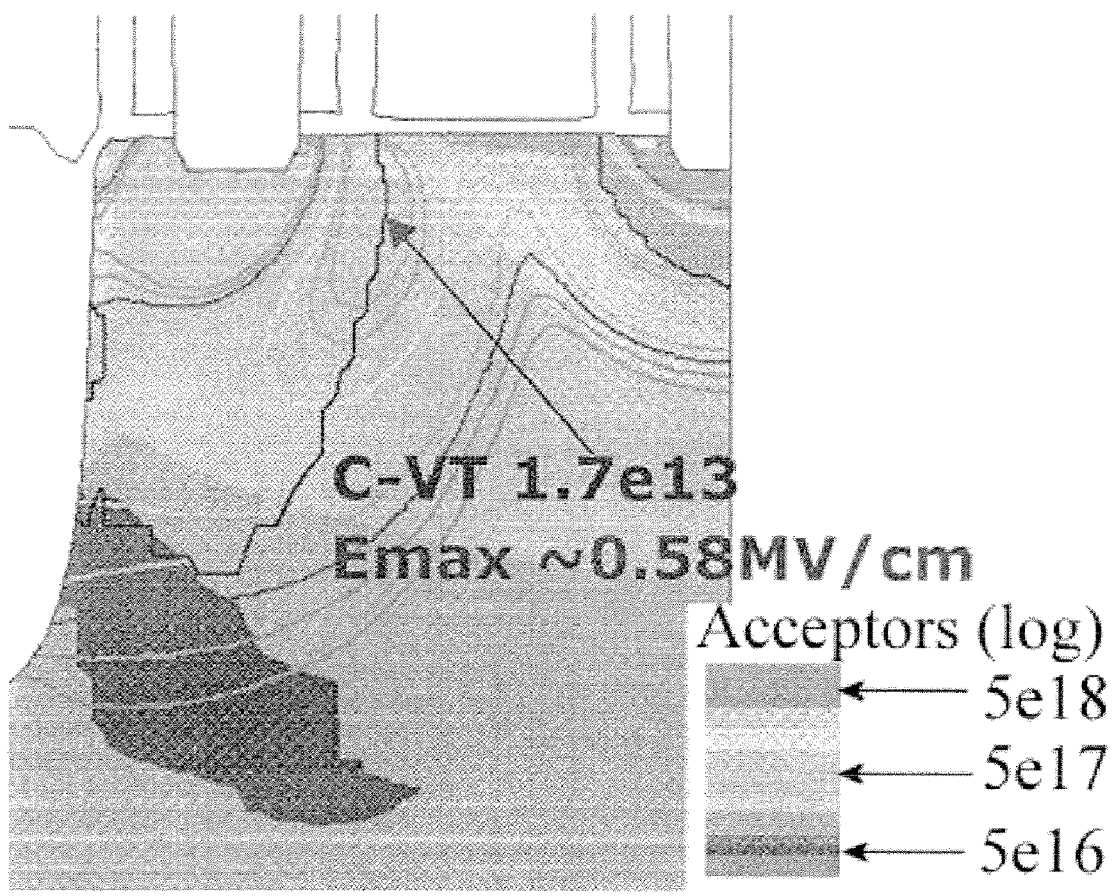
FIG. 2 is a schematic view illustrating a simulated electric field distribution of transistors manufactured in accordance with the conventional transistor manufacturing method.
Figure 3:
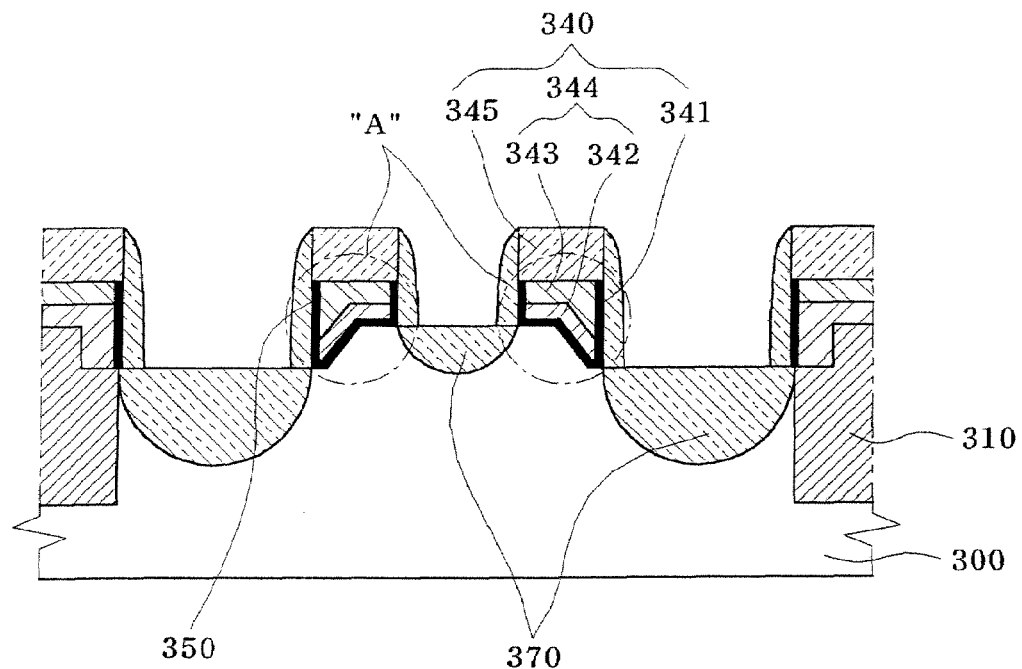
FIG. 3 is a sectional view illustrating a structure of the transistor according to the first embodiment of the present invention.
Figure 5:
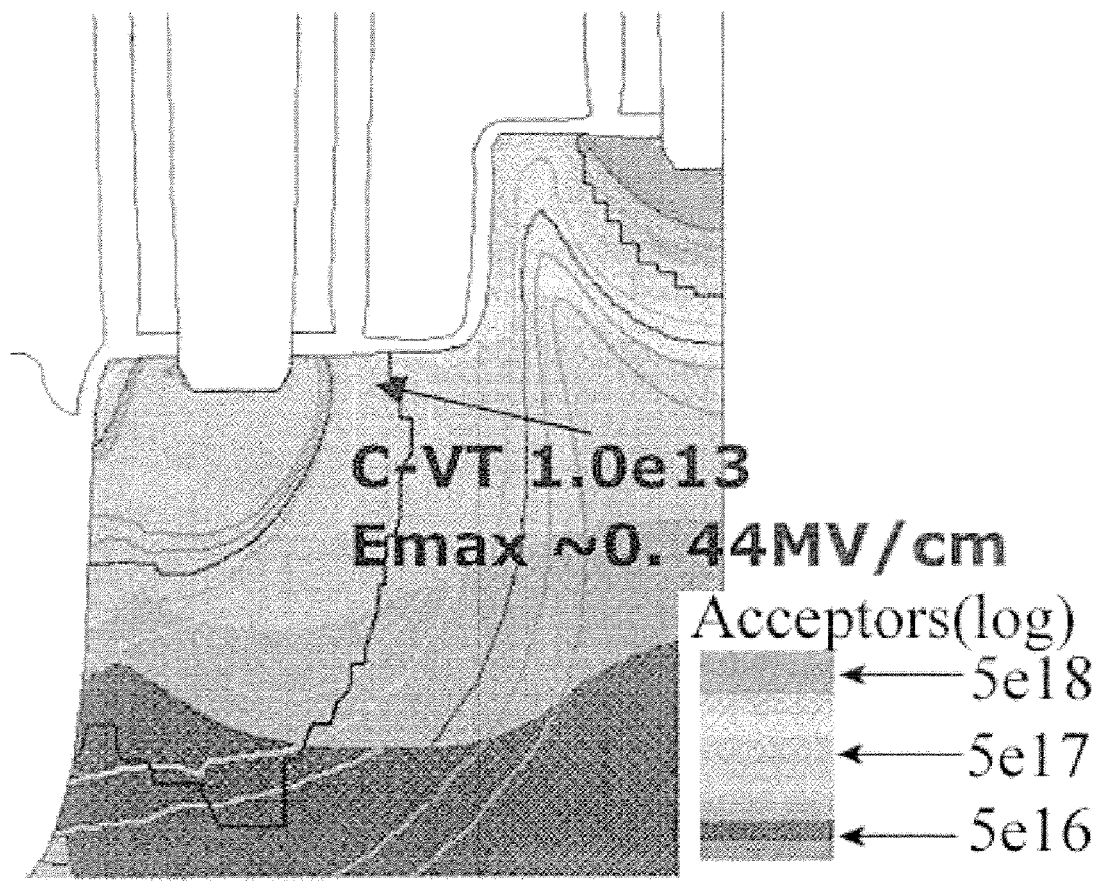
FIG. 5 is a simulated electric field distribution of the transistor according to the first embodiment of the present invention.

FIG. 3 is a sectional view illustrating a structure of the transistor according to the first embodiment of the present invention. FIG. 5 is a simulated electric field distribution of the transistor according to the first embodiment of the present invention.

As shown in FIG. 3, the transistor according to the first embodiment of the present invention includes a semiconductor substrate 300, which is divided into an active region and a device isolation region by a device isolation film 310. A stepped profile is formed at a portion A in the active region of the semiconductor substrate 300. The active region portion A is arranged adjacent to a storage node. The stepped profile has an upper surface, a lower surface, and a side surface extending in a substantially vertical direction. The side surface may have a height of 50 to 2,500 Å and an inclination of 10 to 90°. When the side surface has such a structure, it can serve as a diffusion barrier for source/drain junctions, which are formed in the substrate 300 at opposite sides of a gate 340 to have asymmetrical junction structures.

The gate 340 is formed on a portion of the substrate 300 overlapping with the stepped profile. The gate 340 has a laminated structure comprised of a gate oxide film 341, a gate conductive film 344, and a masking nitride film 345 formed, in this order, on the substrate 300. The gate conductive film 344 has a laminated structure comprised of a gate polysilicon film 342 and a tungsten silicide film 343 laminated in this order.

Since the gate is overlapped with the stepped profile arranged therebeneath, the lower surface of the gate has a corresponding stepped profile. Accordingly, the channel of the gate extends in an increased length along the stepped profile, so that it is possible to minimize the short-channel effect caused by the high integration of the device.

Gate spacers are formed on respective side walls of the gate 340 to protect the gate 340. Each gate spacer is comprised of a side wall oxide film 350 and a side wall nitride film 380 formed, in this order, on the associated side wall of the gate 340.

As described above, the source/drain junctions 370 are arranged at the portions of the substrate 300 at opposite sides of the gate 340, respectively. Also, the source/drain junctions 370 have asymmetrical junction structures to meet the characteristics of the storage and bit line nodes.

As apparent from the above description, the transistor according to the first embodiment of the present invention increases the channel length reduced due to the high integration of the device, using the stepped profile having the upper, lower and side surfaces. Also, the transistor according to the first embodiment of the present invention prevents ion diffusion from being generated between the source/drain junctions having asymmetrical junction structures, using the side surface of the stepped profile as a diffusion barrier.

Referring to the simulated electric field distribution of the transistor according to the first embodiment of the present invention illustrated in FIG. 5, it can be seen that the transistor exhibits a threshold voltage Vt of about 1.0E13V and a maximum electric field intensity of about 0.44MV/cm, and thus, exhibits a low electric field intensity at the storage node, as compared to conventional cases. Thus, it can be expected that the amount of leakage current is relatively low, as compared to the conventional cases.

Hereinafter, the method for manufacturing the transistor according to the first embodiment of the present invention will be described with reference to FIGS. 4A to 4D.

FIG. 4A to 4D are sectional views respectively illustrating processing steps of the method for manufacturing the transistor according to the first embodiment of the present invention.

Figure 4A:
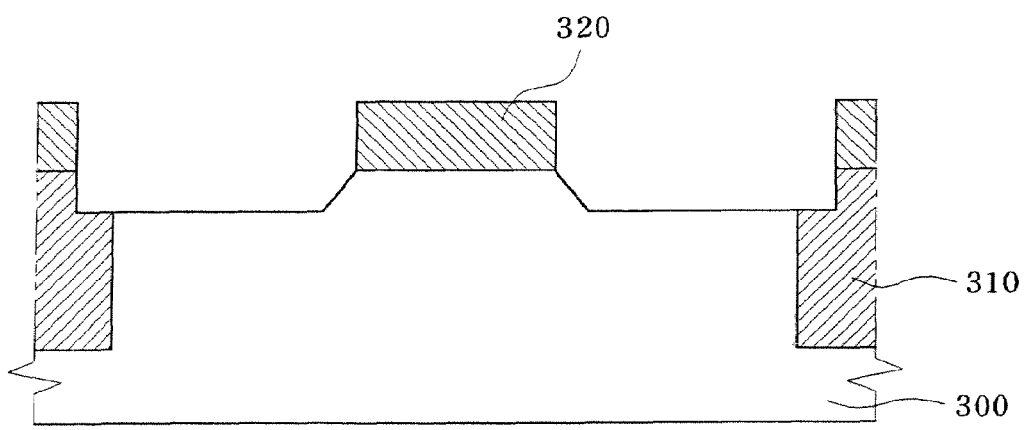
FIG. 4A to 4D are sectional views respectively illustrating processing steps of the method for manufacturing the transistor according to the first embodiment of the present invention.

First, as shown in FIG. 4A, the device isolation film 310 is formed on the semiconductor substrate 300, using a typical device isolation process such as a shallow trench isolation (STI) process, in order to define a device isolation region and an active region in the semiconductor substrate 300.

Thereafter, a step gate mask 320 is formed on the substrate 300 having the device isolation film 310. Using the step gate mask 320 as an etch mask, an etch process is carried out to etch, to a depth of 50 to 2,500 Å, a desired portion of the device isolation film 310 arranged adjacent to a region where a storage node is to be formed, and a portion of the semiconductor substrate 300 corresponding to the active region. Thus, a stepped profile having an upper, lower, and side surfaces is formed. In this case, the step gate mask 320 may be comprised of a photoresist film, an oxide film, or a nitride film alone, or in a state of containing polysilicon. The step gate mask 320 also has a width corresponding to 1 to 3.5 times the width of a gate to be subsequently formed. The etch process is also performed such that the side surface of the stepped profile has an inclination of 10 to 90° with respect to the upper surface of the substrate 300.

In particular, in accordance with the first embodiment of the present invention, the portion of the device isolation film 310 arranged adjacent to the region where the storage node is to be formed is etched in the etch process, together with the portion of the semiconductor substrate 300 corresponding to the active region. Accordingly, the lower surface of the stepped profile extends to a certain portion of the device isolation film 310 arranged adjacent to the active region, so that the step formed on the substrate 330 between the device isolation film 310 and the active region is removed. As a result, it is possible to prevent a short circuit from being generated between a gate electrode and a junction, which will be subsequently formed.

Figure 4B:
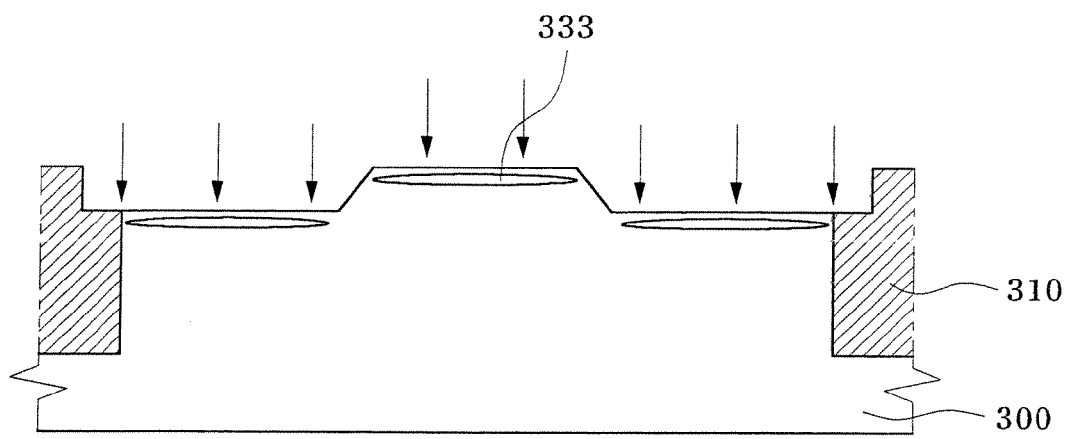

Thereafter, the step gate mask 320 is removed, as shown in FIG. 4B. In this state, first threshold voltage control ions 333 are implanted into the active region of the substrate 300. The first threshold voltage control ions 333 may be low-concentration P-type impurity ions.

Figure 4C:
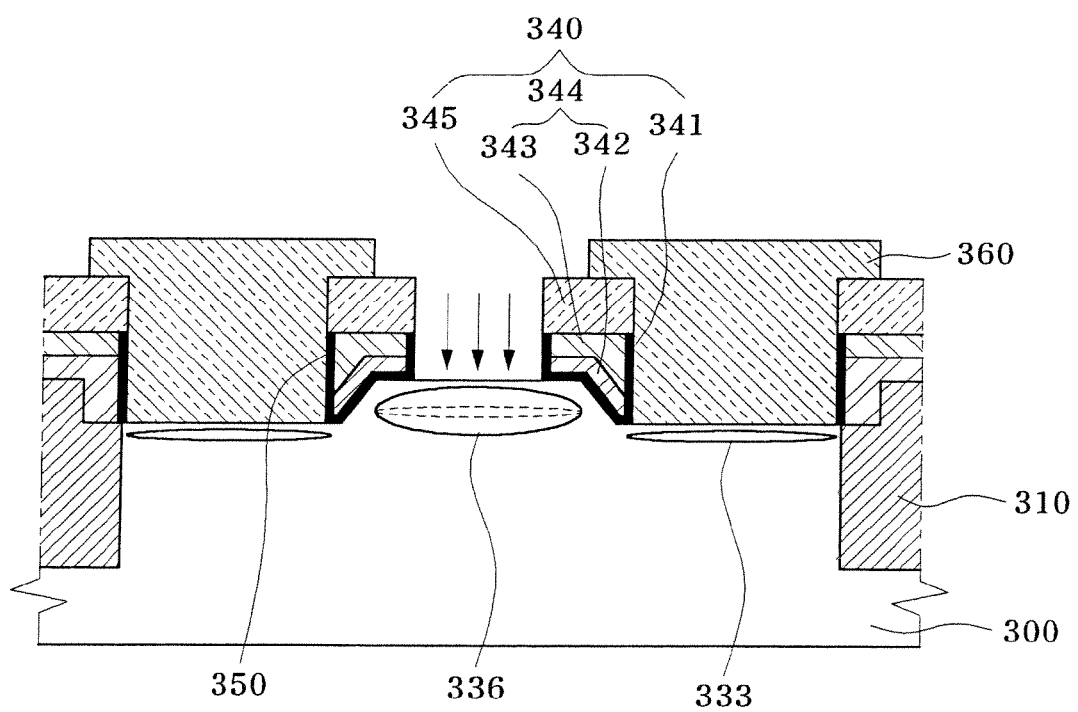

Subsequently, a general gate formation process is performed at a region where the active region of the substrate 300 implanted with the first threshold voltage control ions 333 (not shown) overlaps with the stepped profile, as shown in FIG. 4C. Thus, the gate 340 having a multi-layer structure is formed. In detail, the gate 340 has a laminated structure comprised of the gate oxide film 341, gate conductive film 344, and masking nitride film 345 formed, in this order, on the substrate 300. The gate conductive film 344 has a laminated structure comprised of the gate polysilicon film 342 and tungsten silicide film 343 laminated in this order.

An oxidation process is then performed on side walls of the gate 340 to form the side wall oxide films 350. Each side wall oxide film 350 serve as a barrier to protect the associated side wall of the gate 340 from the surroundings.

Next, a mask 360 is formed on the substrate 300 provided with the side wall oxide films 350 such that the substrate 300 is shielded in a region other than the bit line node formation region. Using the mask 360 as an ion implantation mask, second threshold voltage control ions 336 are implanted into the exposed bit line node formation region. In this case, the second threshold voltage control ions 336 may be P-type impurity ions having a concentration higher than the concentration of the first threshold voltage control ions 333 (FIG. 4B) by 1E17/cm3 or above.

Where the concentration of the P-type impurity ions implanted in the bit line node formation region is higher than the concentration of the P-type impurity ions implanted in the storage node formation region by 1E17/cm3 or above, as described above, it is possible to form source/drain junctions having asymmetrical junction structures meeting respective characteristics of the source/drain junctions in a subsequent junction formation process, in which n type impurity ions are implanted as source/drain formation ions.

Figure 4D:
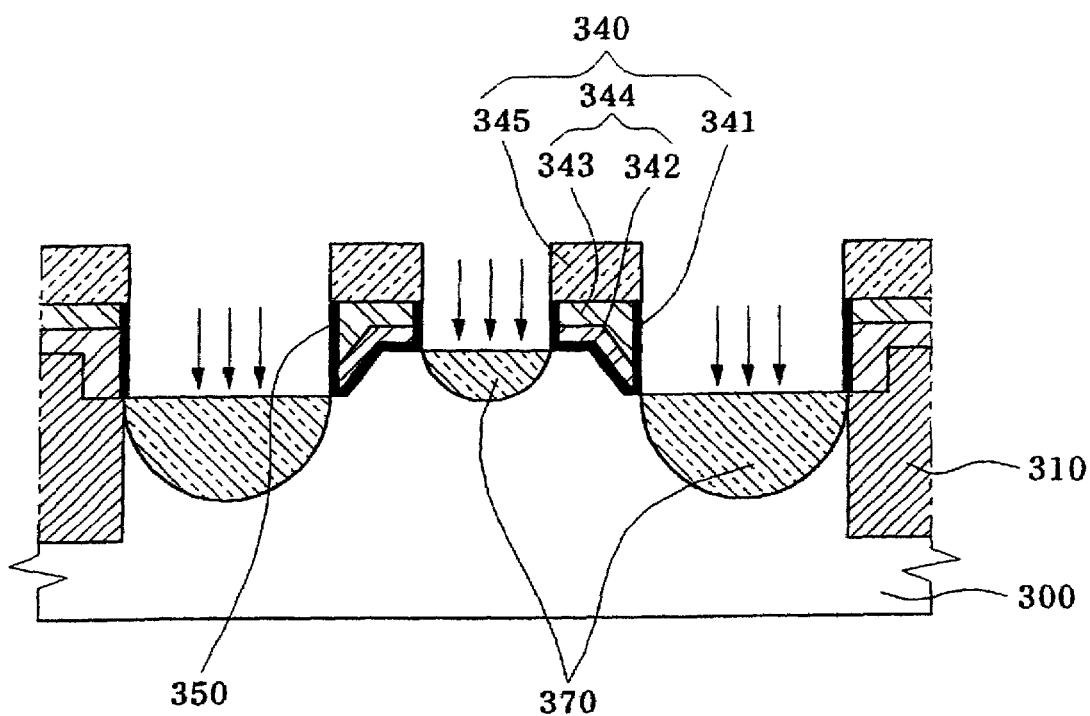

Thereafter, the source/drain formation ions are implanted into portions of the active region of the substrate 300 not covered with the gate 340 to form the source drain junctions 370, as shown in FIG. 4D. In this case, the source/drain junctions 370 have asymmetrical junction structures meeting respective characteristics of the source/drain junctions 370 in accordance with the concentration difference between the first and second threshold voltage control ions previously implanted in the substrate 300.

Next, a nitride film (not shown) is deposited over the entire upper surface of the substrate 300 formed with the source/drain junctions 370. The nitride film is then spacer-etched to form a side wall nitride film 380 on each side wall of the gate 340. The side wall nitride film 380 is arranged on the associated side wall of the gate 340, together with the side wall oxide film 350, thereby forming a gate spacer (shown in FIG. 3).

Hereinafter, a transistor according to a second embodiment of the present invention will be described with reference to FIG. 6 and FIG. 3.

Figure 6:
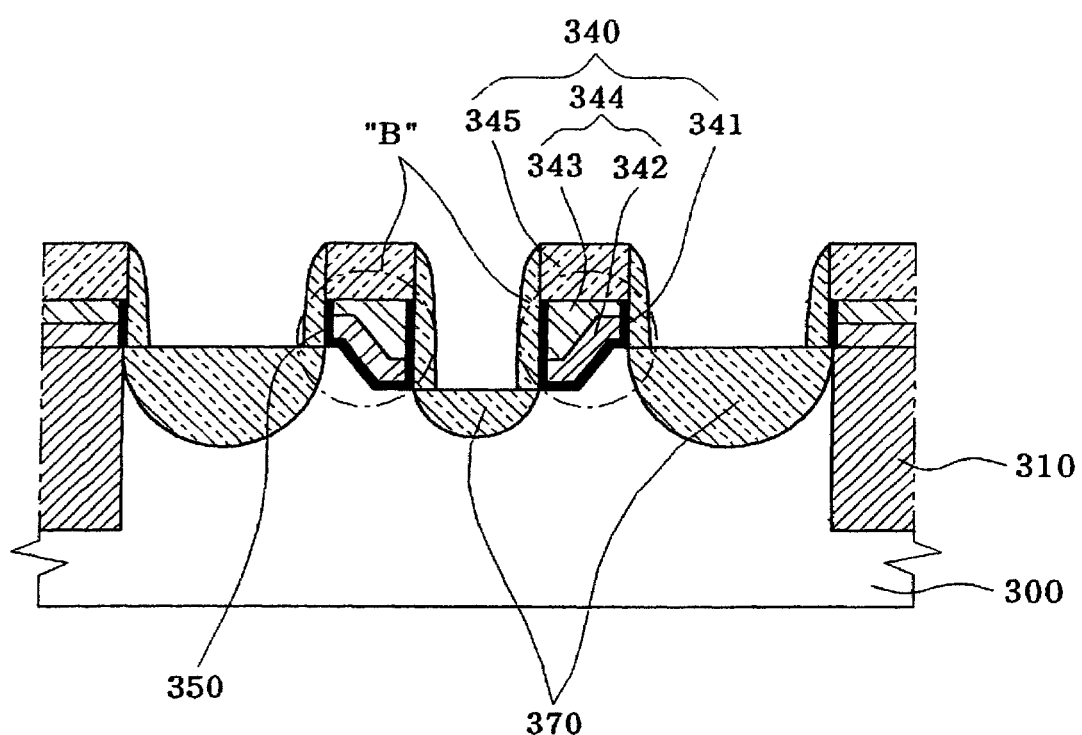
FIG. 6 is a sectional view illustrating a structure of a transistor according to a second embodiment of the present invention.

FIG. 6 is a sectional view illustrating a structure of the transistor according to the second embodiment of the present invention.

The structure of the transistor according to the second embodiment of the present invention shown in FIG. 6 is mainly identical to that of the first embodiment. Accordingly, the following description will be given of only the structural portion of the transistor of the second embodiment different from that of the first embodiment.

The transistor of the second embodiment is different from that of the first embodiment in terms of the positions of the upper and lower surfaces of the stepped profile. That is, in the stepped profile in the transistor according to the first embodiment, the lower surface thereof extends over the storage node and a portion of the gate formation region arranged adjacent to the storage node, as shown in the portion "A" of FIG. 3, in order to minimize the step defined between the active region and the device isolation region, and thus, to prevent a short circuit from being generated between the gate and the junction. However, in the stepped profile in the transistor according to the second embodiment, the lower surface thereof extends over the bit line node and a portion of the gate formation region arranged adjacent to the bit line node, as shown in the portion "B" of FIG. 6.

Of course, the transistor structure of the second embodiment has the same effect as that of the first embodiment because both the stepped profiles of the first and second embodiments have side surfaces serving as diffusion barriers, respectively.

Figure 7:
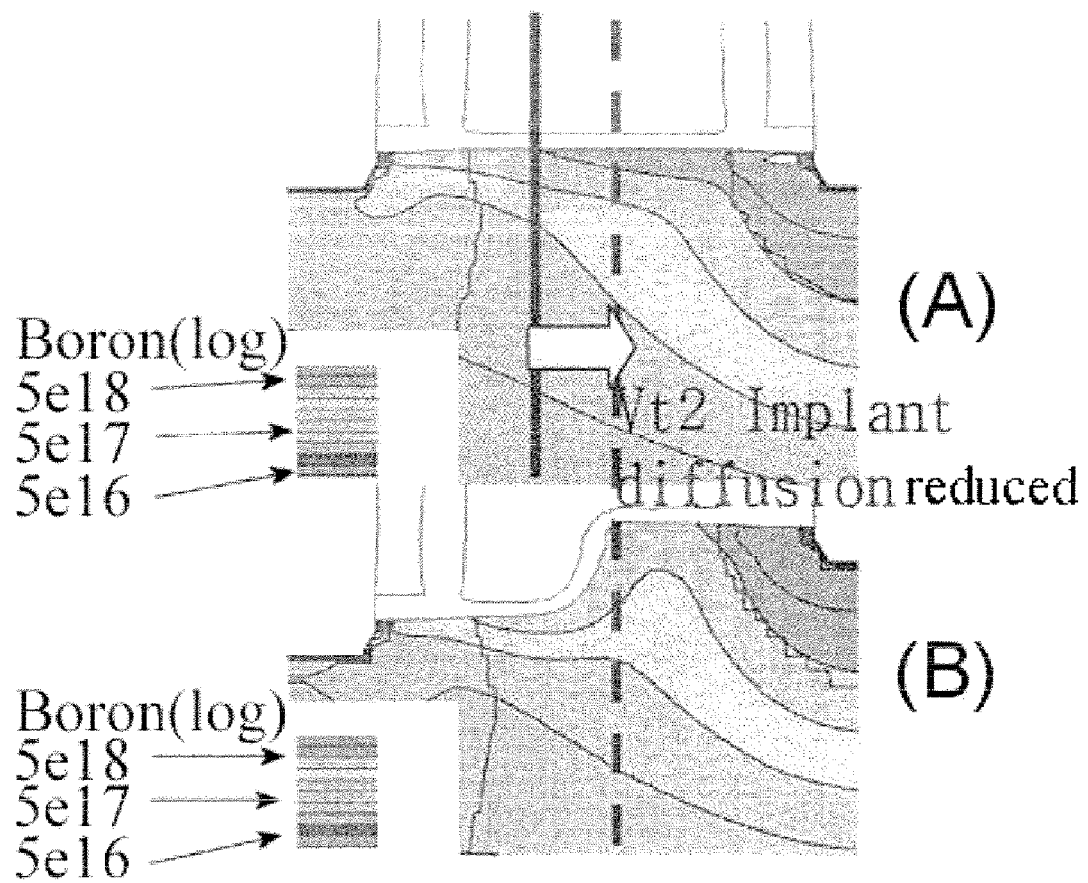
FIG. 7 is a diagram depicting simulated threshold voltage control impurity distributions of the conventional transistor and the transistor according to the first embodiment of the present invention.

The effects of the transistors according to the above-described embodiments of the present invention will be summarized with reference to FIG. 7. Referring to FIG. 7, it can be seen that, when an additional ion implantation process is performed at the bit line node to form junction regions having asymmetrical structures in the case A corresponding to the conventional transistor, ions additionally implanted in the bit line node diffused into the storage node, thereby causing an increase in electric field intensity. As a result, an increase in the amount of leakage current occurs, so that a degradation in refresh characteristics occurs. However, in the case B corresponding to the transistor of the present invention, a desired channel length is secured in accordance with the stepped profile having a side surface. The side surface of the stepped profile also prevents the ions additionally implanted in the bit line node from being diffused into the storage node. Accordingly, it is possible to prevent an increase in the ion concentration of the storage node, and thus, to reduce an electric field concentration phenomenon. As a result, an improvement in the refresh characteristics of the device is achieved.

As apparent from the above description, in accordance with the present invention, it is possible to increase the effective channel length of the gate by virtue of the stepped profile. The side surface of the stepped profile is also used as a diffusion barrier to prevent ion diffusion from occurring between the storage node and the bit line node, and thus, to stabilize the characteristics of the device. Accordingly, there is an advantage in that the refresh characteristics of the device are improved.

What is claimed is:

1. A transistor comprising:
 a semiconductor substrate having an active region, wherein the active region is defined with a device isolation region and has a stepped profile between an upper surface and a lower surface;
 a gate formed on the semiconductor substrate, wherein the gate is disposed to overlap with the step profile;
 insulating spacers formed on respective side walls of the gate;
 asymmetrical source junction and drain junction in the semiconductor substrate, wherein the source junction is disposed under the lower surface and the drain junction is disposed under the upper surface, and a concentration of the source junction is different from that of the drain junction; and
 channel region between the source junction and drain junction, wherein the channel region is overlapped with the stepped profile.

2. The transistor according to claim 1, wherein the stepped profile has a height of 50 to 2,500Å.

3. The transistor according to claim 1, wherein the stepped profile has a side of an inclination of 10 to 90°.

4. The transistor according to claim 1, wherein the lower and upper surfaces of the stepped profile have the same area.

5. The transistor according to claim 1, wherein the lower surface is arranged adjacent to a bit line node.

6. The transistor according to claim 1, wherein the lower surface extends over a storage node and a predetermined portion of the device isolation region arranged adjacent to the storage node.

* * * * *